United States Patent
Horikawa et al.

(10) Patent No.: US 10,247,882 B2
(45) Date of Patent: Apr. 2, 2019

(54) OPTICAL WAVEGUIDE CIRCUIT AND METHOD OF FABRICATING SAME

(71) Applicants: NEC CORPORATION, Tokyo (JP); Photonics Electronics Technology Research Association, Tokyo (JP)

(72) Inventors: Tsuyoshi Horikawa, Tokyo (JP); Tohru Mogami, Tokyo (JP); Keizo Kinoshita, Tokyo (JP)

(73) Assignees: NEC CORPORATION, Tokyo (JP); PHOTONICS ELECTRONICS TECHNOLOGY RESEARCH ASSOCIATION, Tokyo (JP)

( * ) Notice: Subject to any disclaimer, the term of this patent is extended or adjusted under 35 U.S.C. 154(b) by 31 days.

(21) Appl. No.: 15/692,062

(22) Filed: Aug. 31, 2017

(65) Prior Publication Data

US 2018/0067260 A1 Mar. 8, 2018

(30) Foreign Application Priority Data

Sep. 2, 2016 (JP) ................................. 2016-171424

(51) Int. Cl.
| | |
|---|---|
| *G02B 6/13* | (2006.01) |
| *G02B 6/132* | (2006.01) |
| *C23C 14/08* | (2006.01) |
| *C23C 14/48* | (2006.01) |
| *G02B 6/122* | (2006.01) |
| *G02B 6/12* | (2006.01) |

(52) U.S. Cl.
CPC ............ *G02B 6/132* (2013.01); *C23C 14/083* (2013.01); *C23C 14/48* (2013.01); *G02B 6/122* (2013.01); *G02B 2006/12061* (2013.01)

(58) Field of Classification Search
CPC .................... G02B 6/132; G02B 6/122; G02B 2006/12061; C23C 14/083; C23C 14/48
USPC .......................................................... 385/131
See application file for complete search history.

(56) References Cited

U.S. PATENT DOCUMENTS

| | | | |
|---|---|---|---|
| 5,491,768 A * | 2/1996 | Chan ..................... | G02B 6/1347 385/132 |
| 2003/0041624 A1* | 3/2003 | Won ........................ | C03C 15/00 65/386 |
| 2006/0039666 A1* | 2/2006 | Knights ............. | G02B 6/12004 385/129 |
| 2010/0111461 A1* | 5/2010 | Takahashi ............... | G02F 1/011 385/1 |

FOREIGN PATENT DOCUMENTS

JP 2002-090558 3/2002

* cited by examiner

*Primary Examiner* — Jerry M Blevins
(74) *Attorney, Agent, or Firm* — Young & Thompson (57) ABSTRACT

Provided is an optical waveguide circuit avoiding the difficulty of the property compensation based on temperature control, compensated with respect to the property variations due to fabrication error, particularly paid attention in a silicon waveguide, and being low in power consumption and high in performances. The optical waveguide circuit includes a silicon (Si) substrate, a buried oxide film (BOX) layer formed on the Si substrate, and an SOI (Silicon on Insulator) layer, formed on the BOX layer, including an optical element utilizing the SOI layer as a main optical transmission medium. At least part of a waveguide of the optical element includes uniformly distributed and thermally unstable crystal defects.

18 Claims, 8 Drawing Sheets

OPTICAL WAVEGUIDE CIRCUIT AND METHOD OF FABRICATING SAME

This application is based upon and claims the benefit of priority from Japanese patent application No. 2016-171424, filed on Sep. 2, 2016, the disclosure of which is incorporated herein in its entirety by reference.

TECHNICAL FIELD

The invention relates to an optical waveguide circuit and a method of fabricating the same, more specifically, to an optical waveguide circuit mounting a multi/demultiplexer, a branching device and the like used for the wavelength division multiplexing communication and the like, and being fabricated by using the silicon photonics technique, and a method of fabricating the same.

BACKGROUND ART

Recently, due to the development of various social networks such as cloud computing and social networking, the content of information using communication line has been dramatically increased. For the purpose of coping with such a rapid increase of the information content, techniques to attain the increase of the bandwidth of information communication have been sought. The wavelength division multiplexing (WDM) communication using silicon photonics technique is one of such attempts, and is expected to be capable of attaining broadband communication on the basis of compact and inexpensive circuits as compared with the conventional silica-based wavelength division multiplexing communication.

In WDM scheme, lights of a plurality of proximal wavelengths are multiplexed and are simultaneously transmitted, and accordingly, there is required a function of multiplexing the light signals of a plurality of wavelengths, and extracting optical signals of optional wavelengths from the multiplexed light signals. A device actualizing such a function is an optical waveguide circuit mounting a multi/demultiplexer and the like.

In an optical waveguide circuit using silicon photonics technique, a multi/demultiplexer such as an AWG uses silicon as a waveguiding medium. However, in a silicon waveguide, the variation of the light refractive index is possibly caused due to a slight deviation in the waveguide width caused during fabrication or the temperature of the use environment. Accordingly, when a silicon waveguide is used for an optical waveguide circuit for the wavelength division multiplexing communication or the like, there has been required a compensation based on the modulation of the temperature of the device.

The regulation based on the thermal compensation of the optical waveguide for the wavelength division multiplexing communication is generally applied to WDM devices using silica waveguides. For example, JP2002-90558A discloses an optical waveguide element module for wavelength division multiplexing communication using a silica-based waveguide. The optical waveguide element module is controlled in temperature by a Peltier module formed by arranging a plurality of thermoelectric elements, between two insulating plates having a conductor circuit formed on one surface thereof, so as to be connected to the conductor circuits.

SUMMARY

Such a compensation scheme as described above, based on the temperature control of the optical waveguide circuit suffers from a problem that the device structure comes to be complicated, and the miniaturization of the device is difficult.

In view of such conventional circumstances, an example object of the invention is to provide an optical waveguide circuit avoiding the difficulty of the property compensation based on temperature control and a method of fabricating the same.

An optical waveguide circuit according to an example aspect of the invention includes a silicon (Si) substrate, a buried oxide film (BOX) layer formed on the Si substrate, and an SOI (Silicon on Insulator) layer formed on the BOX layer and including an optical element utilizing the SOI layer as a main optical transmission medium, in which at least part of a waveguide of the optical element includes uniformly distributed and thermally unstable crystal defects.

A method of fabricating the optical waveguide circuit according to an example aspect of the invention includes: a step of forming the SOI (Silicon on Insulator) layer on the buried oxide film (BOX) layer formed on the silicon (Si) substrate; a step of forming the optical element utilizing the SOI layer as a main optical transmission medium by processing the SOI layer; a step of forming a clad layer on the SOI layer; a step of forming a metal wiring(s) on the clad layer; and a step of generating, by ion implantation, thermally unstable crystal defects at least in part of the optical element in the SOI layer and generating thermally stable crystal defects at least in part of a region, in the Si substrate, close to the BOX layer and situated under the metal wiring(s).

According to the invention, it is possible to provide an optical waveguide circuit avoiding the difficulty of the property compensation based on temperature control and a method of fabricating the same.

EXAMPLE EMBODIMENT

Hereinafter, an example embodiment is described in detail with reference to the drawings.

Figure 1:
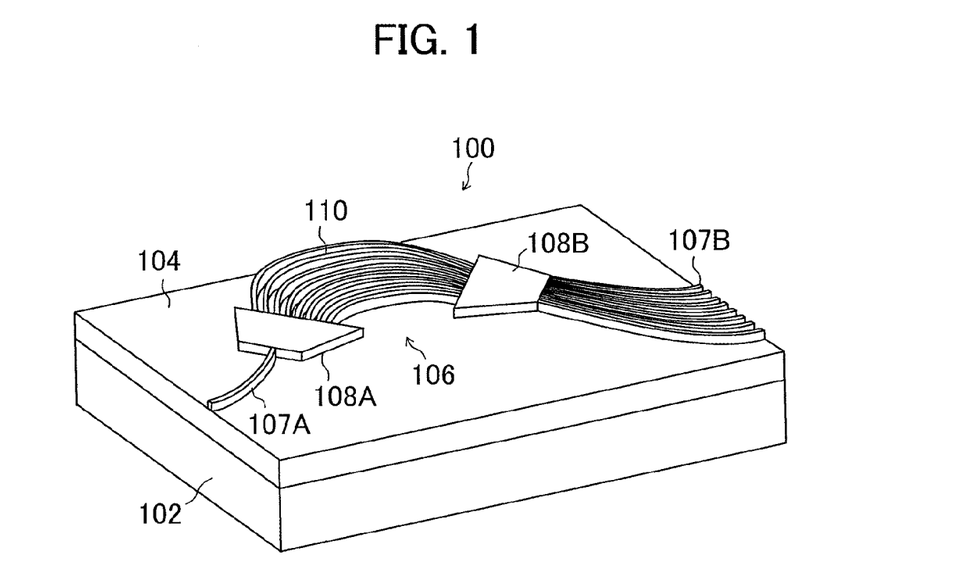
FIG. 1 shows a schematic oblique perspective diagram of the optical waveguide circuit according to an example embodiment.

FIG. 1 is a schematic oblique perspective diagram of optical waveguide circuit 100 according to an example embodiment. Optical waveguide circuit 100 includes silicon (Si) substrate 102, buried oxide film (BOX) layer 104 formed on Si substrate 102, made of a silica glass ($SiO_2$), and SOI (Silicon on Insulator) layer 106 formed on BOX layer 104.

In the example of FIG. 1, there is provided in SOI layer 106 an arrayed waveguide grating (AWG) as an optical element utilizing SOI layer 106 as a main optical transmission medium. The AWG shown in FIG. 1 includes input port 107A formed of a waveguide, output port 107B formed of eight waveguides, input coupler 108A, output coupler 108B, and arrayed waveguide 110. In an present example embodiment, AWG is constituted so as to partially include crystal defects. For example, arrayed waveguide 110 of the AWG may be constituted at least partially so as to include uniformly distributed and thermally unstable crystal defects. In FIG. 1, in order to simplify the diagram, only the AWG is formed in SOI layer 106. However, in place of the AWG or in addition to the AWG, various optical elements having optical waveguides such as a ring resonator and a directional coupler may be formed in SOI layer 106 of optical waveguide circuit 100 of the invention.

Figure 2:
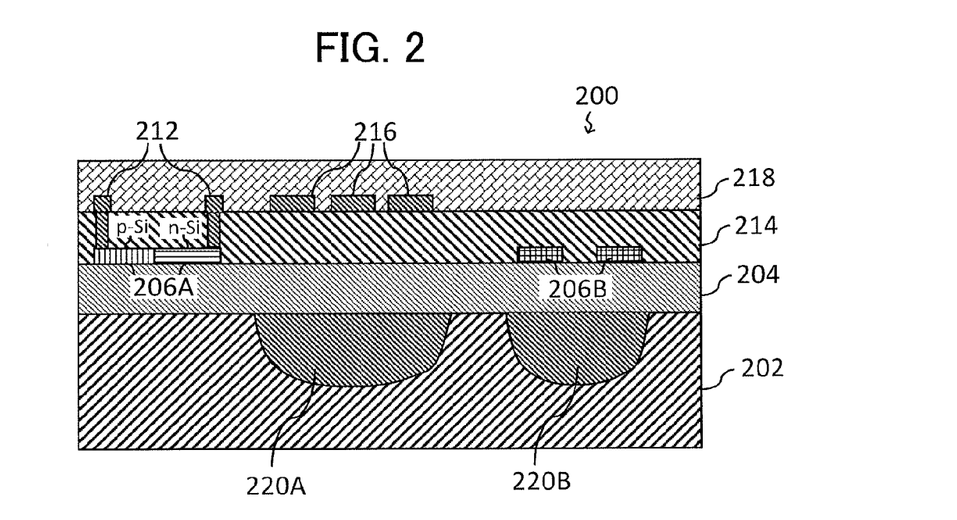
FIG. 2 shows a schematic cross-sectional diagram of the optical waveguide circuit according to an example embodiment.

FIG. 2 shows a schematic cross-sectional diagram of optical waveguide circuit 200 according to an example embodiment. Optical waveguide circuit 200 includes Si substrate 202, BOX layer 204 formed on a Si substrate, SOI layers 206A and 206B formed on BOX layer 204, clad layer 214 formed on SOI layers 206A and 206B, metal wirings 216 formed on clad layer 214, and passivation layer 218 formed on clad layer 214 and metal wirings 216. Examples of the material of metal wirings 216 may include Al and Cu.

As an example, the thickness of BOX layer 204 may be 0.5 to 3 μm. The thickness of each of SOI layers 206A and 206B may be 0.15 μm to 0.3 μm. The width of each of the waveguides formed in SOI layer 206B may be 0.30 to 0.50 μm or 0.25 μm to 0.40 μm when the band of the transmitted light is the C band or the 0 band. The thickness of clad layer 214 may be 1.0 to 2.0 μm. The thickness of passivation layer 218 may be 0.5 to 1 μm. The width and the height of each wiring included in metal wirings 216 may be 0.5 to 10 μm and 0.5 to 2.0 μm, respectively; the spacings between the wirings may be 0.5 to 20 μm.

As shown in FIG. 2, as an example, an optical modulator including a p-type Si region (p-Si) and an n-type Si region (n-Si) may be formed in SOI layer 206A, and electrodes 212 of the optical modulator may be formed over clad layer 214 and passivation layer 218. In SOI layer 206B, an optical element such as an AWG as shown in FIG. 1 may also be formed. FIG. 2 schematically shows the cross sections of the waveguides of the optical element formed in SOI layer 206B. In this example, metal wirings 216 may be the wirings transmitting the high-frequency (for example, RF) electric signals for driving the optical modulator.

The waveguides of the optical element formed in SOI layer 206B are at least partially constituted so as to include uniformly distributed and thermally unstable crystal defects. For example, the crystal defects may be formed so as to uniformly distributed in a plane parallel to the interface between BOX layer 204 and SOI layer 206B.

In optical waveguide circuit 200, by a heat treatment (annealing treatment) at 150° C. or higher and 400° C. or lower, irreversible changes may be caused in the refractive index of at least part of the waveguide including crystal defects in SOI layer 206B, and/or the transmission spectrum of optical waveguide circuit 200. As will be described later, for example, the conditions of the temperature of the annealing treatment are determined in such a way that the optical element formed in SOI layer 206B may have desired performances (such as a transmission spectrum).

Si substrate 202 may be constituted in such a way that at least part (defect forming region 220A) of a region close ("adjacent" in example embodiment shown in FIG. 2) to BOX layer 204 and situated under the metal wiring 216 includes the thermally stable crystal defects. According to this constitution, it is possible to remarkably increase the resistivity of part of Si substrate 202 situated under metal wiring 216 transmitting a high-frequency electric signal. For example, the resistivity of defect-forming region 220A is higher than the resistivity of the other portion of Si substrate 202, and may be 500 Ω·cm or more. Thus, even when metal wiring 216 transmits a high-frequency electric signal such as an RF electric signal, the band degradation of metal wiring 216 can be prevented, and a satisfactory transmission property can be achieved.

Defect-forming region 220A may be present over a depth of 5 μm or more from the interface between Si substrate 202 and BOX layer 204. Defect-forming region 220A may also be present over a depth of 10 μm or more (for example, 10 to 30 μm) from the surface of the passivation layer 218 opposite to clad layer 214. Defect-forming region 220A may also be constituted in such a way that defects are uniformly distributed in a plane parallel to the interface between Si substrate 202 and BOX layer 204.

Si substrate 202 may also be constituted in such a way that at least part of a region (defect-forming region 220B) close to BOX layer 204 and situated under at least part (for example, waveguide) of the optical element in SOI layer 206B includes thermally stable crystal defects. As will be described later, defect-forming region 220B is formed by the same step as the step of forming defects in SOI layer 206B and defect-forming region 220A.

Figure 3:
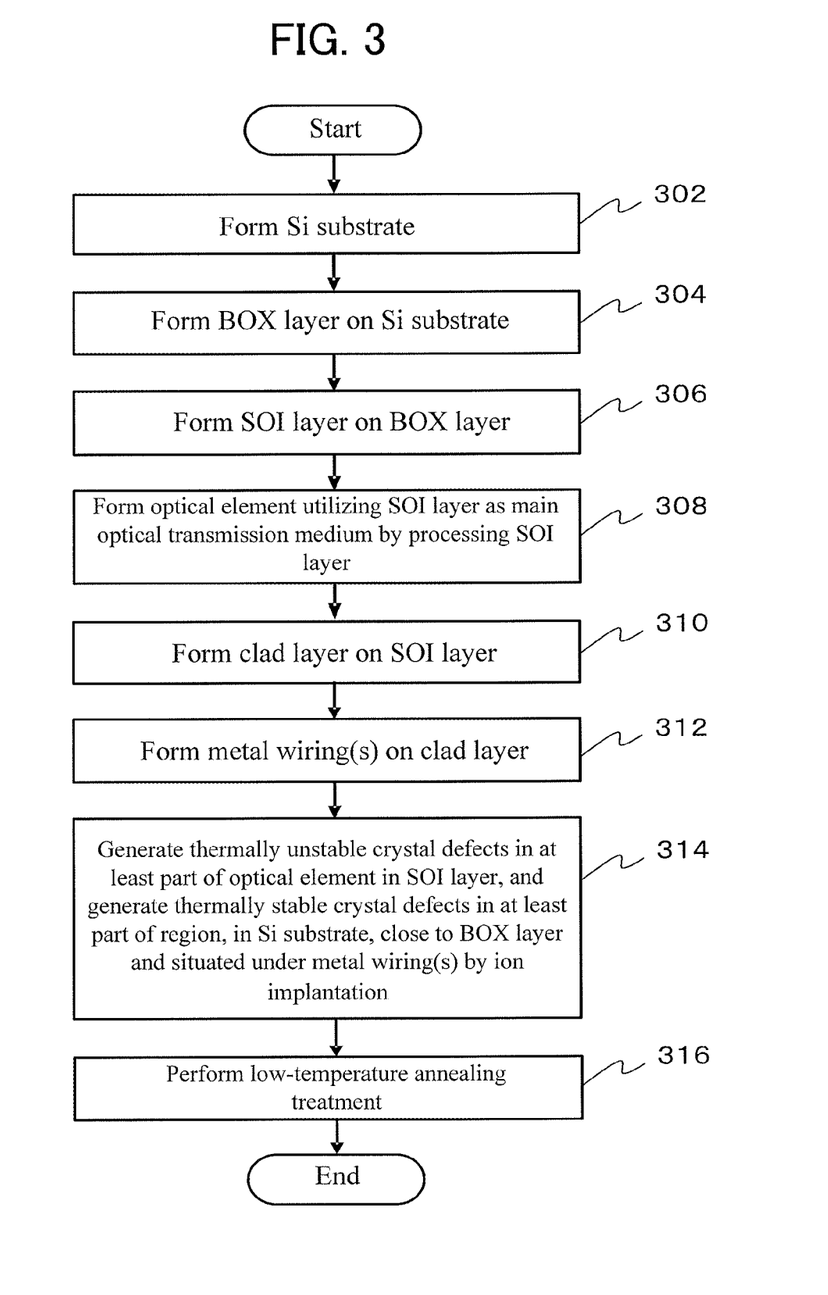
FIG. 3 is a flow chart showing the method of fabricating the optical waveguide circuit according to an example embodiment.

FIG. 3 is a flow chart showing the method of fabricating the optical waveguide circuit according to an example embodiment. FIG. 4A to FIG. 4J each show a schematic cross-sectional diagram of an optical waveguide circuit in the fabrication process. Hereinafter, as an example, there is described a method of fabricating an optical waveguide circuit in which an optical element having an optical waveguide such as an AWG and an optical modulator having a PN junction are integrated. Such an optical waveguide circuit may be used, for example, for constituting a transmitter in an optical communication system.

The structure of the optical waveguide circuit described in FIG. 3 and FIG. 4A to FIG. 4J is only an example. It may be obvious for persons skilled in the art from an example embodiment that optical waveguide circuits having various optical elements formed in the SOI layer can be fabricated.

Figure 4A:
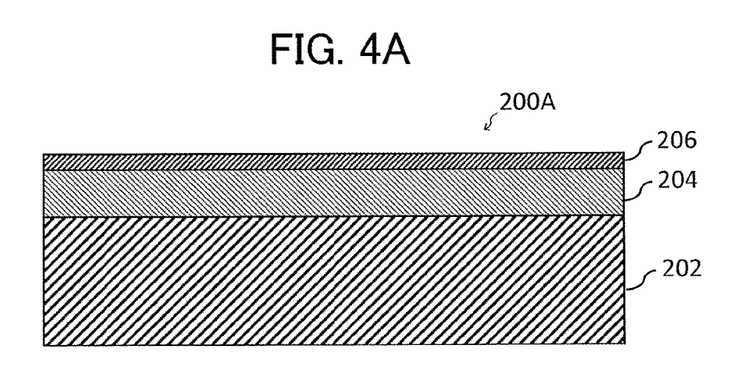
FIG. 4A shows a schematic cross-sectional diagram of a structure fabricated in the process of the treatment of FIG. 3.

In step 302, Si substrate 202 is formed. In step 304, BOX layer 204 is formed on Si substrate 202. In step 306, SOI layer 206 is formed on BOX layer 204. FIG. 4A shows a schematic cross-sectional diagram of the structure 200A fabricated as a result of steps 302 to 306. As an example, the thickness of BOX layer 204 may be 0.5 to 3.0 μm, and the thickness of SOI layer 206 may be 0.15 μm to 0.30 μm.

Figure 4B:
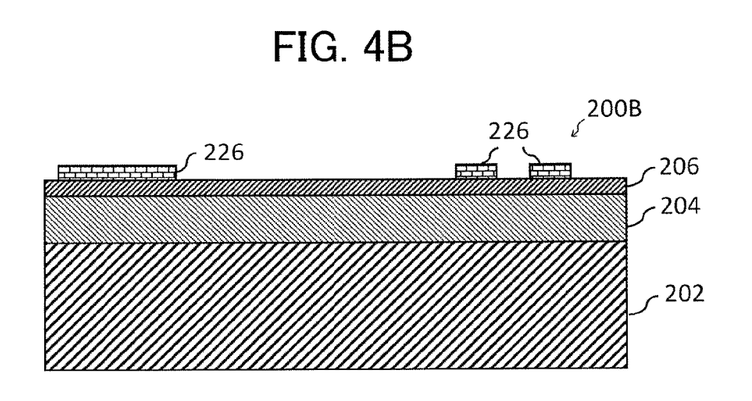
FIG. 4B shows a schematic cross-sectional diagram of a structure fabricated in the process of the treatment of FIG. 3.
Figure 4C:
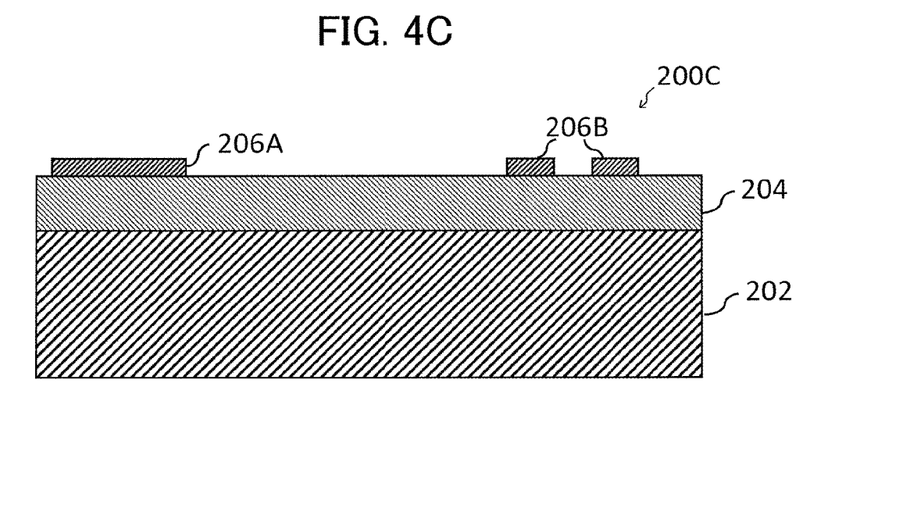
FIG. 4C shows a schematic cross-sectional diagram of a structure fabricated in the process of the treatment of FIG. 3.

In step 308, SOI layer 206 is processed, and an optical element utilizing SOI layer 206 as a main optical transmission medium is formed in SOI layer 206. The process of step 308 is specifically described hereinafter with reference to FIG. 4B to FIG. 4D. As shown in FIG. 4B, of SOI layer 206, in the region in which an optical modulator and an optical element are to be formed, resist mask 226 is formed by lithography, and thus structure 200B is obtained. The lithography technique applied herein can include, for example, photolithography techniques such as ArF excimer lithography, KrF excimer lithography, and liquid immersion ArF excimer lithography, and electron beam lithography technique. As an example, the thickness of resist mask 226 may be 0.1 to 0.3 μm. Subsequently, by anisotropic dry etching, the portions of SOI layer 206 corresponding to the openings of resist mask 226 are removed. Moreover, residual resist mask 226 is incinerated by dry incineration and removed. FIG. 4C shows a schematic cross-sectional diagram of fabricated structure 200C. In the portion in which the optical modulator is to be formed, SOI layer 206A is formed. In the portion in which the optical elements such as an AWG are to be formed, SOI layer 206B is formed. By this process, the desired optical elements such as an AWG are formed in SOI layer 206B. SOI layer 206B shown in FIG. 4C represents the cross section of part (for example, a waveguide) of such an optical elements.

Figure 4D:
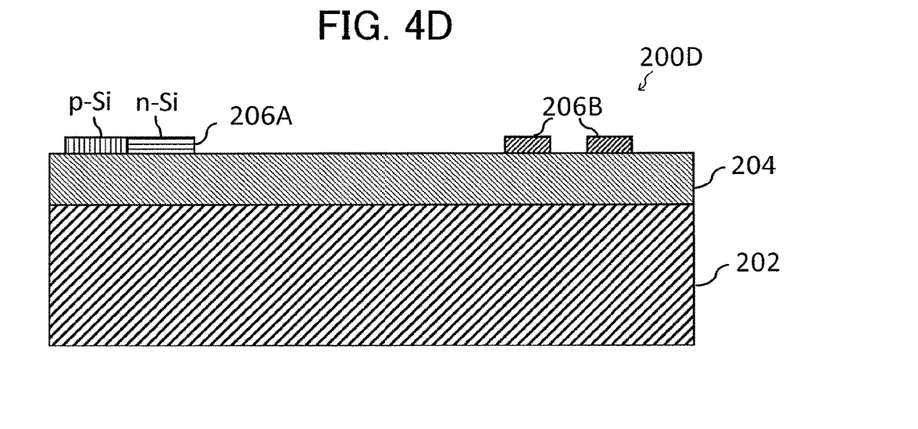
FIG. 4D shows a schematic cross-sectional diagram of a structure fabricated in the process of the treatment of FIG. 3.

Subsequently, by ion implantation and activation annealing, an impurity is introduced into SOI layer 206A in which the optical modulator is to be fabricated. For example, by mask formation based on lithography, ion implantation and mask removal based on dry incineration, a portion of SOI layer 206A may be turned into a P-type Si region, and another portion of SOI layer 206A may be turned into an n-type Si region. As an example, the thickness of resist mask 226 used may be 0.5 to 1.0 μm. The ion implantation species used to form the p-type region may include phosphorus, and the ion implantation species used to form the n-type region may include arsenic, boron and the like. The acceleration energy in ion implantation may be, for example, 5 to 50 keV. The dose amount in the ion implantation may be, for example, $10^{14}$ to $10^{15}$/cm$^2$. The activation annealing temperature may be, for example, 900 to 1500° C. The concentration of the impurity consequently introduced into SOI layer 206A may be, for example, $10^{17}$ to $10^{20}$/cm$^3$. FIG. 4D shows a schematic cross-sectional diagram of fabricated structure 200D. In SOI layer 206A in which the optical modulator is to be formed, a p-type Si region (p-Si) and an n-type Si region (n-Si) are formed.

Figure 4E:
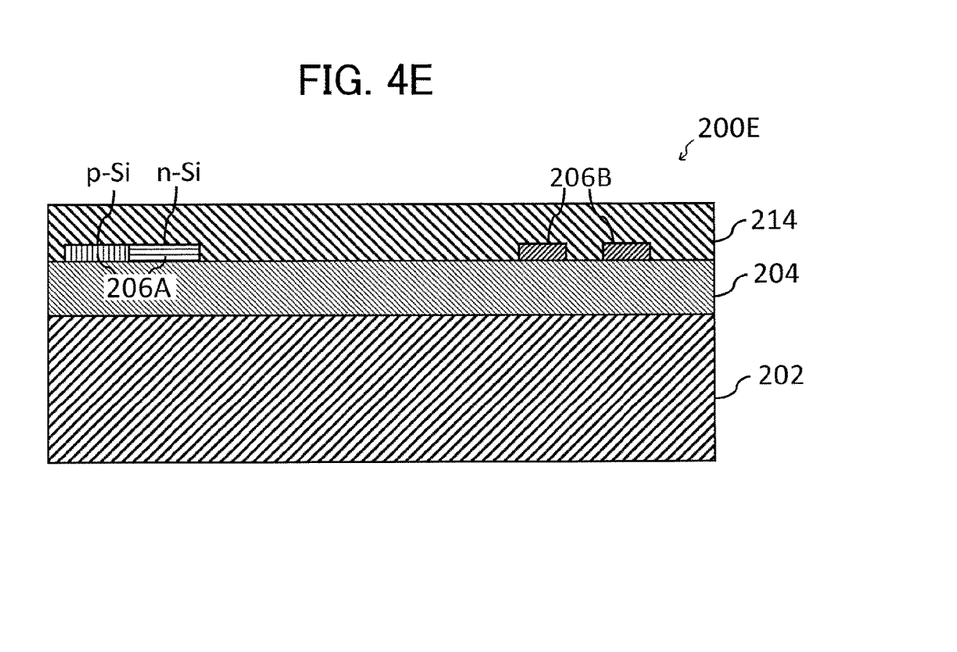
FIG. 4E shows a schematic cross-sectional diagram of a structure fabricated in the process of the treatment of FIG. 3.

In step 310, clad layer 214 composed of SiO$_2$ is formed over SOI layers 206A and 206B. Clad layer 214 may be formed by, for example, chemical vapor deposition or plasma chemical vapor deposition. In this case, a mixed gas composed of silicon-containing gas such as TEOS (Tetraethyl orthosilicate) or monosilane gas and oxidation gas such as oxygen may be used as a raw material gas. FIG. 4E shows a schematic cross-sectional diagram of fabricated structure 200E. As an example, the thickness of clad layer 214 may be 1.0 to 2.0 μm.

Figure 4F:
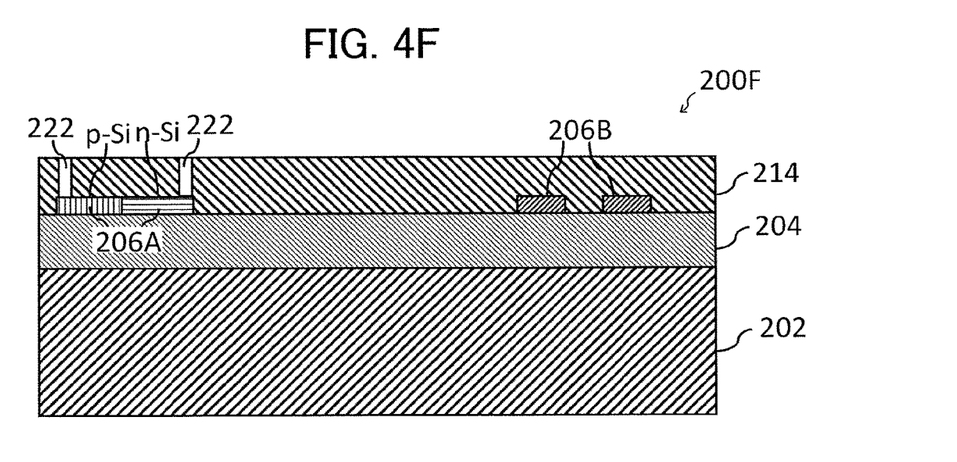
FIG. 4F shows a schematic cross-sectional diagram of a structure fabricated in the process of the treatment of FIG. 3.

In step 312, metal wirings 216 are formed on clad layer 214. The process of step 312 is specifically described hereinafter with reference to FIG. 4F to FIG. 4H. First, in order to form the electrode of the optical modulator, an anisotropic dry etching is applied to clad layer 214 to form contact holes 222 to reach SOI layer 206A. FIG. 4F shows a schematic cross-sectional diagram of fabricated structure 200F.

Figure 4G:
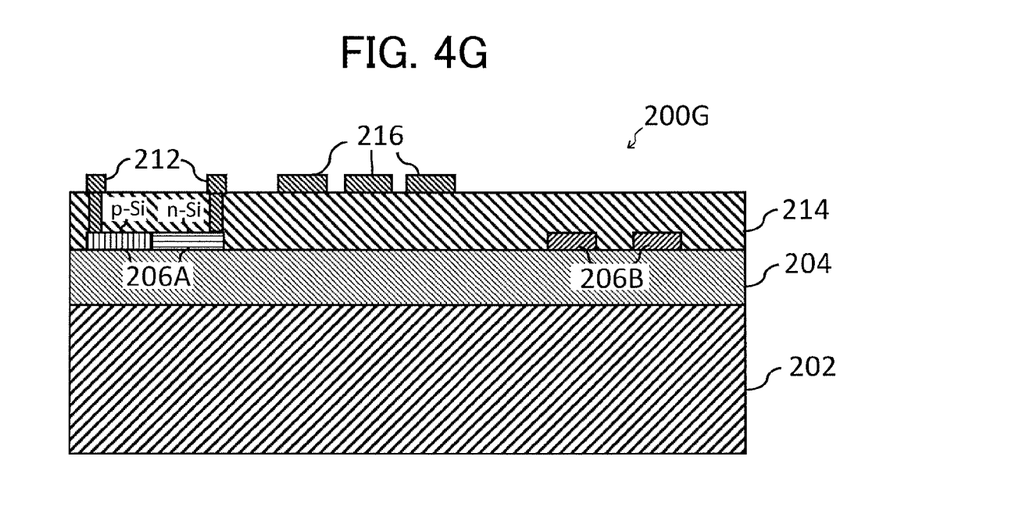
FIG. 4G shows a schematic cross-sectional diagram of a structure fabricated in the process of the treatment of FIG. 3.

Subsequently, metal wirings 216 and electrodes 212 are formed on clad layer 214. As an example, by performing a sputtering treatment using, for example, Al or Cu as a material, metal wirings 216 and electrodes 212 may be formed. In this example, metal wirings 216 are used for transmitting high frequency electric signals applied to the optical modulator. The width of each of the wirings may be 0.5 to 10 μm, the height of each of the wirings may be 0.5 to 2.0 μm, and the spacings between the wirings may be 0.5 to 20 μm. FIG. 4G shows a schematic cross-sectional diagram of fabricated structure 200G. The above-described constitution is only an example, metal wirings 216 can be constituted so as to have various structures and sized according to the various components formed in SOI layer 206A.

Figure 4H:
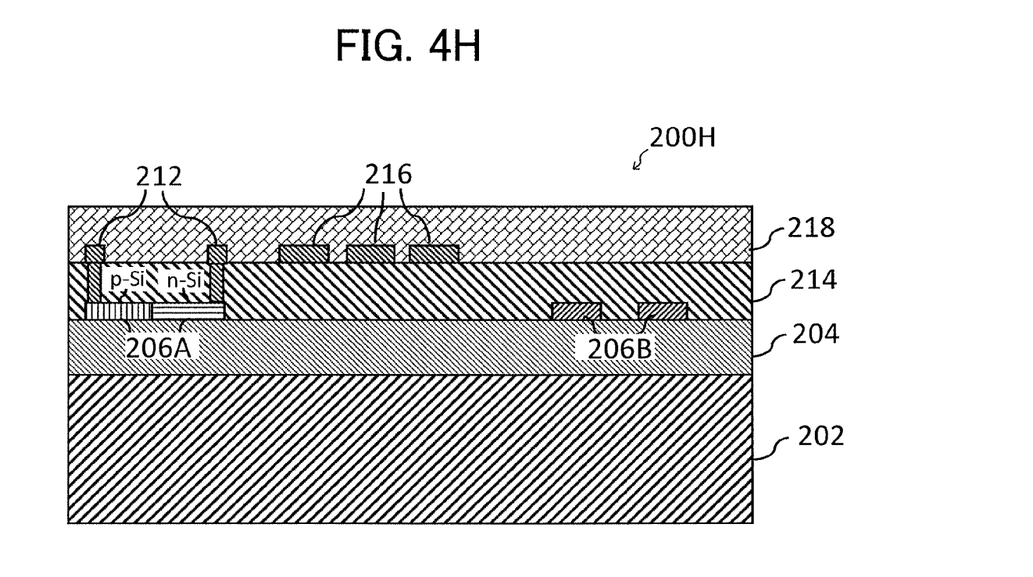
FIG. 4H shows a schematic cross-sectional diagram of a structure fabricated in the process of the treatment of FIG. 3.

As structure 200H shown in FIG. 4H, passivation layer 218 covering metal wirings 216, electrodes 212 and clad layer 214 may be formed.

In step 314, ion implantation is performed, thus thermally unstable crystal defects are generated at least in part of the optical element formed in SOI layer 206B, and thermally stable crystal defects are generated at least in part of the region, in Si substrate 202, close to BOX layer 204 and situated under metal wirings 216.

Figure 4I:
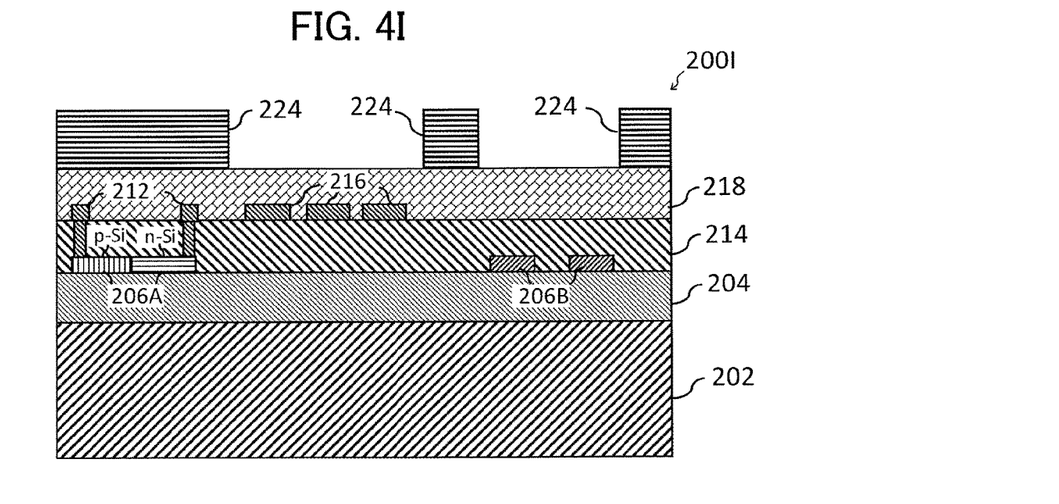
FIG. 4I shows a schematic cross-sectional diagram of a structure fabricated in the process of the treatment of FIG. 3.

The process in step 314 is specifically described hereinafter with reference to FIG. 4I and FIG. 4J. As shown in FIG. 4I, mask 224 is formed on passivation layer 218 except for the portion corresponding to at least part of SOI layer 206B and the portion corresponding to at least part of metal wirings 216. For the purpose of performing a high-energy ion implantation, mask 224 may be, for example, a metal mask having a thickness of 20 μm or more. As an example, mask 224 may be a metal plate processed so as to have holes in the portions corresponding to at least part of metal wirings 216 and the portions corresponding to at least part of SOI layer 206B. The metal plate concerned is not necessarily required to be closely attached to passivation layer 218, and may be arranged so as to have a spacing from passivation layer 218. As another example, mask 224 may be constituted so as to include the same materials as the materials of resist mask 226 used in the process of FIG. 4B, and mask 224 may be constituted so as to have a thickness (for example, 10 to 20 μm) larger than the thickness values of common masks. FIG. 4I shows a schematic cross-sectional diagram of fabricated structure 200I.

Figure 4J:
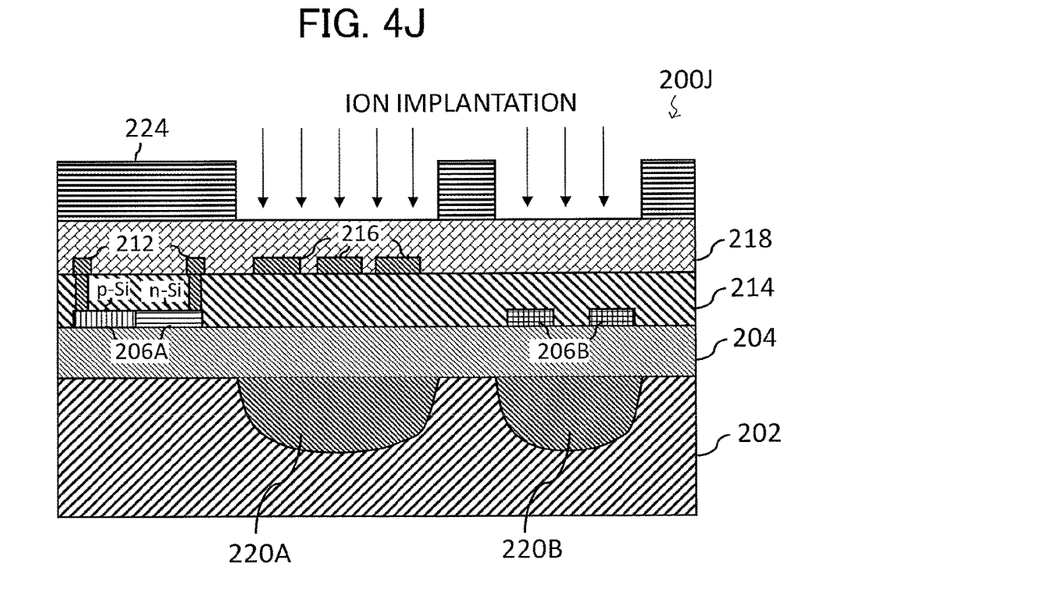
FIG. 4J shows a schematic cross-sectional diagram of a structure fabricated in the process of the treatment of FIG. 3.

Subsequently, as shown in FIG. 4J, by performing a high-accelerated ion implantation and by performing an activation annealing, defects are formed in SOI layer 206B and Si substrate 202. The ion species used may be a light element, and may be one ion species or a plurality of ion species selected from the group consisting of hydrogen (such as $^1$H$^+$), helium (such as $^3$He$^+$ or $^4$He$^+$), nitrogen, and silicon. The acceleration energy of the ion implantation may be, for example, 1 to 50 MeV. The dose amount of the ion implantation may be, for example, $10^{13}$ to $10^{15}$/cm$^2$. The activation annealing temperature may be, for example, 900 to 1050° C. The concentration of the impurity consequently introduced into SOI layer 206B may be, for example, $10^{16}/cm^3$ or less.

The defects introduced by such a high-accelerated ion implantation as described above can be uniformly distributed in a plane parallel to the irradiation plane of the high-accelerated ion (for example, in a plane parallel to the interfaces between the respective layers). On the other hand, the distribution of the defects in the depth direction is not uniform but the density of the defects is largest in the vicinity of the ion range. In an example embodiment, the acceleration energy of ion implantation may be set in such a way that the ion range is approximately 10 to 30 µm from the surface of the passivation layer 218 opposite to clad layer 214. Thus, in the region, in Si substrate 202, close to BOX layer 204 and situated under metal wirings 216 transmitting high-frequency electric signals, hole-type thermally stable (namely, hardly recoverable by a low-temperature annealing treatment) defects are formed in a high density (defect-forming region 220A, shown in FIG. 4J). Consequently, the resistance of the region concerned is remarkably increased. For example, the resistivity of defect-forming region 220A is higher than the resistivity of the other portions of Si substrate 202 and can be 500 Ω·cm or more. Accordingly, according to an example embodiment, the band degradation of metal wirings 216 can be prevented and a satisfactory transmission property can be achieved.

On the other hand, by the high-accelerated ion implantation, defects are introduced into the portion not covered with mask 224 (for example, the waveguides of the optical element formed in SOI layer 206B) of SOI layer 206B. Because SOI layer 206B is situated at a distance apart from the ion range, the defects formed in SOI layer 206B are lower in density and can be thermally unstable (namely, recoverable by a low-temperature annealing treatment) as compared with the defects formed in defect-forming region 220A.

It is to be noted that as shown in FIG. 4J, by the high-accelerated ion implantation, in at least part of the region, in Si substrate 202, close to BOX layer 204 and situated under SOI layer 206B, defect-forming region 220B similar to defect-forming region 220A is formed.

Subsequently, as shown in step 316, a low-temperature annealing treatment is applied. By the annealing treatment, the refractive index of only the portion, undergoing the formation of the defects, of SOI layer 206B can be variously regulated. The temperature range of the annealing treatment in this case may be set at, for example, 150 to 400° C. A bump formation heat treatment performed (for example, at 300 to 400° C.) when optical waveguide circuit 200 is mounted on another substrate can be used in combination as the annealing treatment. The temperature of the annealing treatment is determined in such a way that by the regulation of the refractive index of at least part (for example, a waveguide) of the optical element formed in SOI layer 206B, the performances of the optical element can be improved. Defect-forming region 220A in Si substrate 202 is also heated by the annealing treatment. However, as has already been described, the defects introduced into defect-forming region 220A are higher in density and thermally stable as compared with the defects introduced into SOI layer 206B. Consequently, even when an annealing treatment is performed in order to regulate the refractive index of the waveguide of the optical element in SOI layer 206B, the resistivity of defect-forming region 220A can be maintained to be high.

It is to be noted that when Al is used as the material for metal wirings 216, by a heat treatment at a temperature higher than 400° C., a shape abnormality such as a hillock formation of the Al wiring can be generated. However, as described above, according to an example embodiment, by an annealing treatment at a temperature lower than 400° C., the regulation of the refractive index of the optical element in SOI layer 206B can be performed, and hence the generation of such a shape abnormality of metal wirings 216 can be prevented. As another example, also when Cu is used as the material for metal wirings 216, by using the annealing treatment in the above-described temperature range, the generation of abnormality can be prevented.

In addition, the temperature in the environment in which optical waveguide circuit 200 is actually used is usually lower than 120° C. Consequently, even when optical waveguide circuit 200 is used in an actual environment after the regulation of the refractive index of the waveguides of the optical element in SOI layer 206B is performed by the low-temperature annealing treatment in such a way that optical waveguide circuit 200 has the desired properties (such as transmission property), the change of the refractive index of SOI layer 206B or the change of the resistivity of defect-forming region 220A are not caused. Accordingly, according to an example embodiment, it is possible to provide an optical waveguide circuit not requiring temperature control at the time of actual use, being preliminarily compensated with respect to the property variations due to fabrication error, and being low in power consumption and high in performances.

Figure 5:
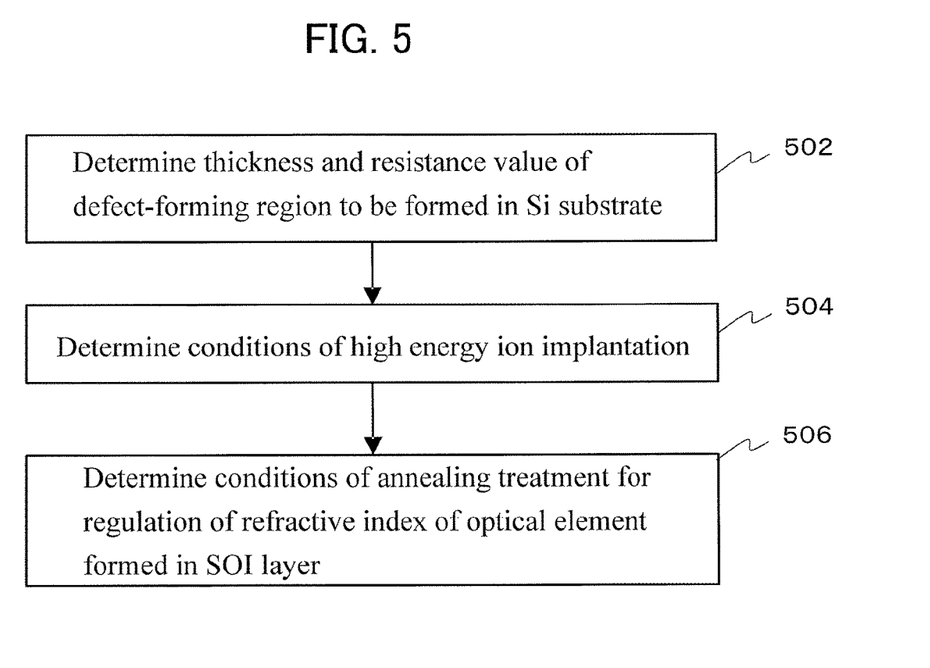
FIG. 5 is a flow chart showing an example of a treatment for determining the conditions of the high-accelerated ion implantation performed in step 314 of FIG. 3 and the conditions of the low-temperature annealing performed in step 316 of FIG. 3.

FIG. 5 is a flow chart showing an example of a process for determining the conditions of the high-accelerated ion implantation performed in step 314 of FIG. 3 and the conditions of the low-temperature annealing performed in step 316 of FIG. 3.

In step 502, determined are the thickness and the resistance value of defect-forming region 220A to be formed in Si substrate 202. The treatment of step 502 can be performed, for example, by carrying out an electromagnetic field simulation using as the parameters the band of the electric signal transmitted by metal wirings 216, and the widths of the respective wirings and the spacings between the respective wirings included in metal wirings 216.

In step 504, determined are the high energy ion implantation conditions (for example, ion species, dose amount, and acceleration energy) determined by step 502 for actualizing the thickness and the resistance value of defect-forming region 220A. The treatment of step 504 can be performed, for example, by performing an ion implantation simulation. Data are acquired with respect to the relation between the band of the electric signal, the widths of the respective wirings and the spacings between the respective wirings and the ion implantation conditions, and the thus acquired data may be stored in a memory device.

In step 506, determined are the conditions (for example, temperature and time) of the annealing treatment used for the regulation of the refractive index of at least part (for example, a waveguide) of the optical element formed in SOI layer 206B. For example, a plurality of optical waveguide circuits 200 are fabricated by the process of FIG. 3, and the optical waveguide circuits are subjected to annealing treatments different from each other in the conditions, respectively; thus, data are acquired with respect to the relations between the annealing treatment conditions and the refractive index of the optical element and/or the transmission spectrum of waveguide circuit 200, and the thus acquired data may be stored in a memory device.

When the optical waveguide circuit is fabricated, by the treatments of steps 502 and 504, the conditions of the high-accelerated ion implantation used in step 314 of FIG. 3 can be determined. Moreover, by the treatment of step 506, the conditions of the low-temperature annealing treatment of step 316 of FIG. 3 can be determined. The above-described conditions may also be determined, for example, by using the data (the data may be in a form of, for example, a data table) preliminarily prepared and stored in a memory device for the relation between the conditions of the ion implantation or the annealing treatment and the structure of the optical element and/or optical waveguide.

While the invention has been particularly shown and described with reference to example embodiments thereof, the invention is not limited to these embodiments. It will be understood by those of ordinary skill in the art that various changes in form and details may be made therein without departing from the spirit and scope of the present invention as defined by the claims.

(Supplementary Note)

Part or the whole of each of the above-described example embodiments may also be described as in the following supplementary note, without being limited to the following.

(Supplementary Note 1)

1. An optical waveguide circuit comprising:
   a silicon (Si) substrate;
   a buried oxide film (BOX) layer formed on the Si substrate; and
   a SOI (Silicon on Insulator) layer, formed on the BOX layer, including an optical element utilizing the SOI layer as a main optical transmission medium;
   wherein at least part of a waveguide of the optical element includes uniformly distributed and thermally unstable crystal defects.

(Supplementary Note 2)

2. The optical waveguide circuit according to supplementary note 1, wherein by a heat treatment at 150° C. or higher and 400° C. or lower, irreversible changes are generated in refractive index of at least the part of the waveguide including the crystal defects and/or in transmission spectrum of the optical waveguide circuit.

(Supplementary Note 3)

3. The optical waveguide circuit according to supplementary note 1 or 2, further comprising:
   a clad layer formed on the SOI layer; and
   a metal wiring formed on the clad layer;
   wherein in the Si substrate, at least part of a region close to the BOX layer and situated under the metal wiring includes thermally stable crystal defects.

(Supplementary Note 4)

4. The optical waveguide circuit according to supplementary note 3, wherein resistivity of at least the part of the region including the crystal defects is higher than resistivity of the other portion of the Si substrate, and is 500 Ω·cm or more.

(Supplementary Note 5)

5. The optical waveguide circuit according to supplementary note 3 or 4, wherein at least the part of the region including the crystal defects is present over a depth of 5 μm or more from an interface between the Si substrate and the BOX layer.

(Supplementary Note 6)

6. The optical waveguide circuit according to one of supplementary notes 3 to 5, further comprising a passivation layer formed on the metal wiring and the clad layer,
   wherein at least the part of the region including the crystal defects is present over a depth of 10 μm or more from a surface of the passivation layer opposite to the clad layer.

(Supplementary Note 7)

7. The optical waveguide circuit according to one of supplementary notes 1 to 6, wherein in the Si substrate, at least part of a region close to the BOX layer and situated under the waveguide of the optical element includes thermally stable crystal defects.

(Supplementary Note 8)

8. A method of fabricating an optical waveguide circuit, comprising:
   forming an SOI (Silicon on Insulator) layer on a buried oxide film (BOX) layer formed on a silicon (Si) substrate;
   forming an optical element utilizing the SOI layer as a main optical transmission medium by processing the SOI layer;
   forming a clad layer on the SOI layer;
   forming a metal wiring on the clad layer; and
   generating thermally unstable crystal defects by ion implantation in at least part of the optical element in the SOI layer, and generating thermally stable crystal defects by ion implantation in at least part of a region, in the Si substrate, close to the BOX layer and situated under the metal wiring.

(Supplementary Note 9)

9. The method of fabricating an optical waveguide circuit according to supplementary note 8, wherein one or more ion species selected from the group consisting of $^1H^+$, $^3He^+$ and $^4He^+$ are used in the ion implantation; implantation energy of at least one of the one or more ion species is 1,000,000 electron volts or more; and dose amount per 1 centimeter square of the at least one ion species is $1\times10^{12}$ to $1\times10^{15}$ ions.

(Supplementary Note 10)

10. The method of fabricating an optical waveguide circuit according to supplementary note 8 or 9, further comprising heat treating at 150° C. or higher and 400° C. or lower after the ion implantation.

(Supplementary Note 11)

11. The method of fabricating an optical waveguide circuit according to one of supplementary notes 8 to 10, wherein in the ion implantation, the range of ions is set at a position apart from the optical element.

(Supplementary Note 12)

12. The method of fabricating an optical waveguide circuit according to one of supplementary notes 8 to 11, wherein in the ion implantation, the range of ions is set in a region, in the Si substrate, close to the BOX layer, and situated under the metal wiring.

What is claimed is:

1. An optical waveguide circuit comprising:
   a silicon (Si) substrate;
   a buried oxide film (BOX) layer formed on the Si substrate;
   a SOI (Silicon on Insulator) layer, formed on the BOX layer, including an optical element utilizing the SOI layer as a main optical transmission medium;
   a clad layer formed on the SOI layer; and
   a metal wiring formed on the clad layer,
   wherein at least part of a waveguide of the optical element includes uniformly distributed and thermally unstable crystal defects, and the Si substrate, at least part of a region close to the BOX layer and situated under the metal wiring includes thermally stable crystal defects.

2. The optical waveguide circuit according to claim 1, wherein by a heat treatment at 150° C. or higher and 400° C. or lower, irreversible changes are generated in refractive index of at least the part of the waveguide including the crystal defects and/or in transmission spectrum of the optical waveguide circuit.

3. The optical waveguide circuit according to claim 2, wherein resistivity of at least the part of the region including the thermally stable crystal defects is higher than resistivity of the other portion of the Si substrate, and is 500 Ω·cm or more.

4. The optical waveguide circuit according to claim 3, wherein at least the part of the region including the thermally stable crystal defects is present over a depth of 5 µm or more from an interface between the Si substrate and the BOX layer.

5. The optical waveguide circuit according to claim 3, wherein in the Si substrate, at least part of a region close to the BOX layer and situated under the waveguide of the optical element includes thermally stable crystal defects.

6. The optical waveguide circuit according to claim 2, wherein at least the part of the region including the thermally stable crystal defects is present over a depth of 5 µm or more from an interface between the Si substrate and the BOX layer.

7. The optical waveguide circuit according to claim 2, further comprising a passivation layer formed on the metal wiring and the clad layer,
wherein at least the part of the region including the thermally stable crystal defects is present over a depth of 10 µm or more from a surface of the passivation layer opposite to the clad layer.

8. The optical waveguide circuit according to claim 2, wherein in the Si substrate, at least part of a region close to the BOX layer and situated under the waveguide of the optical element includes thermally stable crystal defects.

9. The optical waveguide circuit according to claim 1, wherein resistivity of at least the part of the region including the thermally stable crystal defects is higher than resistivity of the other portion of the Si substrate, and is 500 Ω·cm or more.

10. The optical waveguide circuit according to claim 9, wherein at least the part of the region including the thermally stable crystal defects is present over a depth of 5 µm or more from an interface between the Si substrate and the BOX layer.

11. The optical waveguide circuit according to claim 9, wherein in the Si substrate, at least part of a region close to the BOX layer and situated under the waveguide of the optical element includes thermally stable crystal defects.

12. The optical waveguide circuit according to claim 1, wherein at least the part of the region including the thermally stable crystal defects is present over a depth of 5 µm or more from an interface between the Si substrate and the BOX layer.

13. The optical waveguide circuit according to claim 12, wherein in the Si substrate, at least part of a region close to the BOX layer and situated under the waveguide of the optical element includes thermally stable crystal defects.

14. The optical waveguide circuit according to claim 1, further comprising a passivation layer formed on the metal wiring and the clad layer,
wherein at least the part of the region including the thermally stable crystal defects is present over a depth of 10 µm or more from a surface of the passivation layer opposite to the clad layer.

15. The optical waveguide circuit according to claim 1, wherein in the Si substrate, at least part of a region close to the BOX layer and situated under the waveguide of the optical element includes thermally stable crystal defects.

16. A method of fabricating an optical waveguide circuit, comprising:
forming an SOI (Silicon on Insulator) layer on a buried oxide film (BOX) layer formed on a silicon (Si) substrate;
forming an optical element utilizing the SOI layer as a main optical transmission medium by processing the SOI layer;
forming a clad layer on the SOI layer;
forming a metal wiring on the clad layer; and
generating thermally unstable crystal defects by ion implantation in at least part of the optical element in the SOI layer, and generating thermally stable crystal defects by ion implantation in at least part of a region, in the Si substrate, close to the BOX layer and situated under the metal wiring.

17. The method of fabricating an optical waveguide circuit according to claim 16, wherein one or more ion species selected from the group consisting of $^{1}H^{+}$, $^{3}He^{+}$ and $^{4}He^{+}$ are used in the ion implantation; implantation energy of at least one of the one or more ion species is 1,000,000 electron volts or more; and dose amount per 1 centimeter square of the at least one ion species is $1\times10^{12}$ to $1\times10^{15}$ ions.

18. The method of fabricating an optical waveguide circuit according to claim 16, further comprising heat treating at 150° C. or higher and 400° C. or lower after the ion implantation.

* * * * *